(12) United States Patent
Hwang (10) Patent No.: US 7,227,199 B2
(45) Date of Patent: Jun. 5, 2007

(54) IMAGE SENSOR AND METHOD OF MANUFACTURING THE SAME

(75) Inventor: Joon Hwang, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 130 days.

(21) Appl. No.: 11/053,358

(22) Filed: Feb. 8, 2005

(65) Prior Publication Data

US 2005/0156262 A1    Jul. 21, 2005

Related U.S. Application Data

(62) Division of application No. 10/233,143, filed on Aug. 30, 2002, now Pat. No. 6,869,817.

(30) Foreign Application Priority Data

Nov. 16, 2001 (KR) ............................... 2001-71446

(51) Int. Cl.
*H01L 31/0328* (2006.01)
(52) U.S. Cl. ...................... 257/184; 257/187; 257/192; 257/222; 257/226; 257/291; 257/461
(58) Field of Classification Search ...................... None
See application file for complete search history.

(56) References Cited

U.S. PATENT DOCUMENTS

| | | | |
|---|---|---|---|
| 6,225,670 B1 | 5/2001 | Dierickx | |
| 6,410,373 B1 * | 6/2002 | Chang et al. | 438/164 |
| 6,677,656 B2 | 1/2004 | François | |
| 6,690,423 B1 * | 2/2004 | Nakamura et al. | 348/311 |

FOREIGN PATENT DOCUMENTS

KR    20010098144    11/2001

OTHER PUBLICATIONS

Dierickx, et al., "Near-100% fill factor standard CMOS active pixel," IEEE CCD & AIS workshop, Brugge, Belgium, Jun. 5-7, 1997; Proceedings p. P1.
Meynants, et al., "CMOS active pixel image sensor with CCD performance," AFP AEC Europto/SPIE, Zurich, May 18-21, 1998; Proc. Spie, vol. 340, pp. 68-76 (1998).
Notice of Preliminary Rejection issued from the Korean Intellectual Property Office, Aug. 30, 2003.

* cited by examiner

*Primary Examiner*—Wai-Sing Louie
(74) *Attorney, Agent, or Firm*—Marshall, Gerstein & Borun LLP (57) ABSTRACT

Disclosed is a method of manufacturing an image sensor having light sensitivity over a photodiode equal in area to that of a unit pixel. The image sensor includes an image sensor comprising: a first semiconductor substrate doped with a first conductive dopant; a first diffusion layer formed in the semiconductor substrate and doped with a second conductive dopant; a second diffusion layer formed in the semiconductor substrate adjacent the first diffusion layer and having a width wider than a width of the first diffusion layer; a third diffusion layer doped with the first conductive dopant and formed at an exposed surface of the semiconductor substrate in the first diffusion layer; a gate electrode formed on the exposed surface and having a first edge adjacent to the third diffusion layer; and a fourth diffusion layer doped with the second conductive dopant and formed at the exposed surface adjacent a second edge of the gate electrode, the fourth diffusion layer defining a gap with the second diffusion layer.

10 Claims, 9 Drawing Sheets

IMAGE SENSOR AND METHOD OF MANUFACTURING THE SAME

FIELD OF THE INVENTION

The present invention relates to a method of manufacturing a semiconductor device and, more particularly, to a method of manufacturing a complementary metal oxide semiconductor (CMOS) image sensor.

DESCRIPTION OF RELATED ART

Generally, in a charge couple device (CCD) or a complementary metal oxide semiconductor (CMOS) image sensor, a photodiode (PD) functions as a converter to change an incident light into an electric signal. Ideally the quantum efficiency of this conversion is 1 at all wavelengths of light, that is, the incident light is gathered in the photodiode and entirely converted into electric signals.

Figure 1:
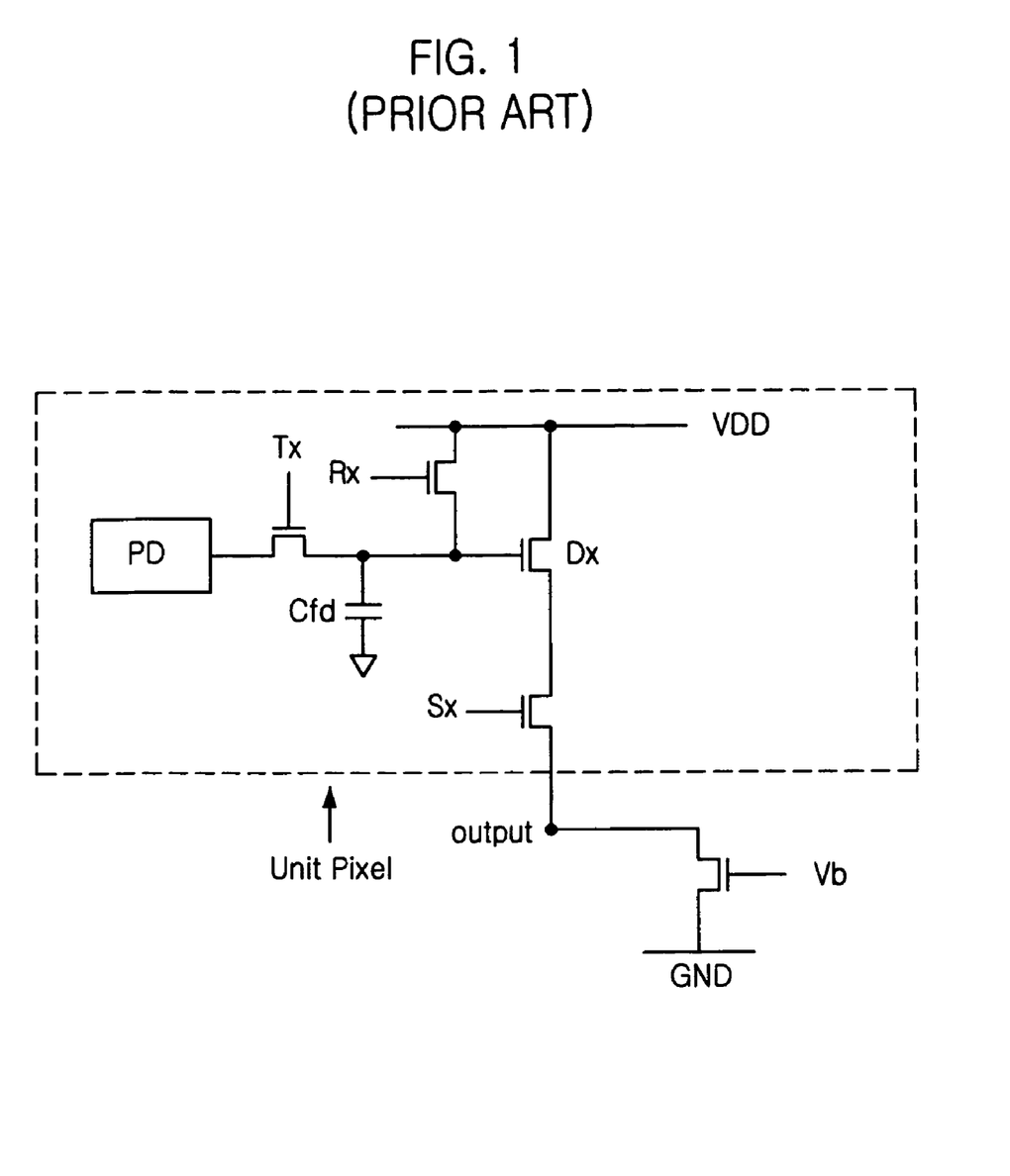
FIG. 1 is an equivalence circuit diagram illustrating a general complementary metal oxide semiconductor (CMOS) image sensor.

FIG. 1 is an equivalence circuit diagram of a general CMOS image sensor unit pixel (UP). The equivalent circuit includes a photodiode (PD) and four n-channel metal oxide semiconductor (NMOS) transistors (Tx, Rx, Dx and Sx). The four NMOS transistors are comprised of a transfer transistor (Tx), a reset transistor (Rx), a drive transistor (Dx) and a select transistor (Sx). There is also a load transistor (Vb) capable of reading an output signal external to the UP.

Figure 2:
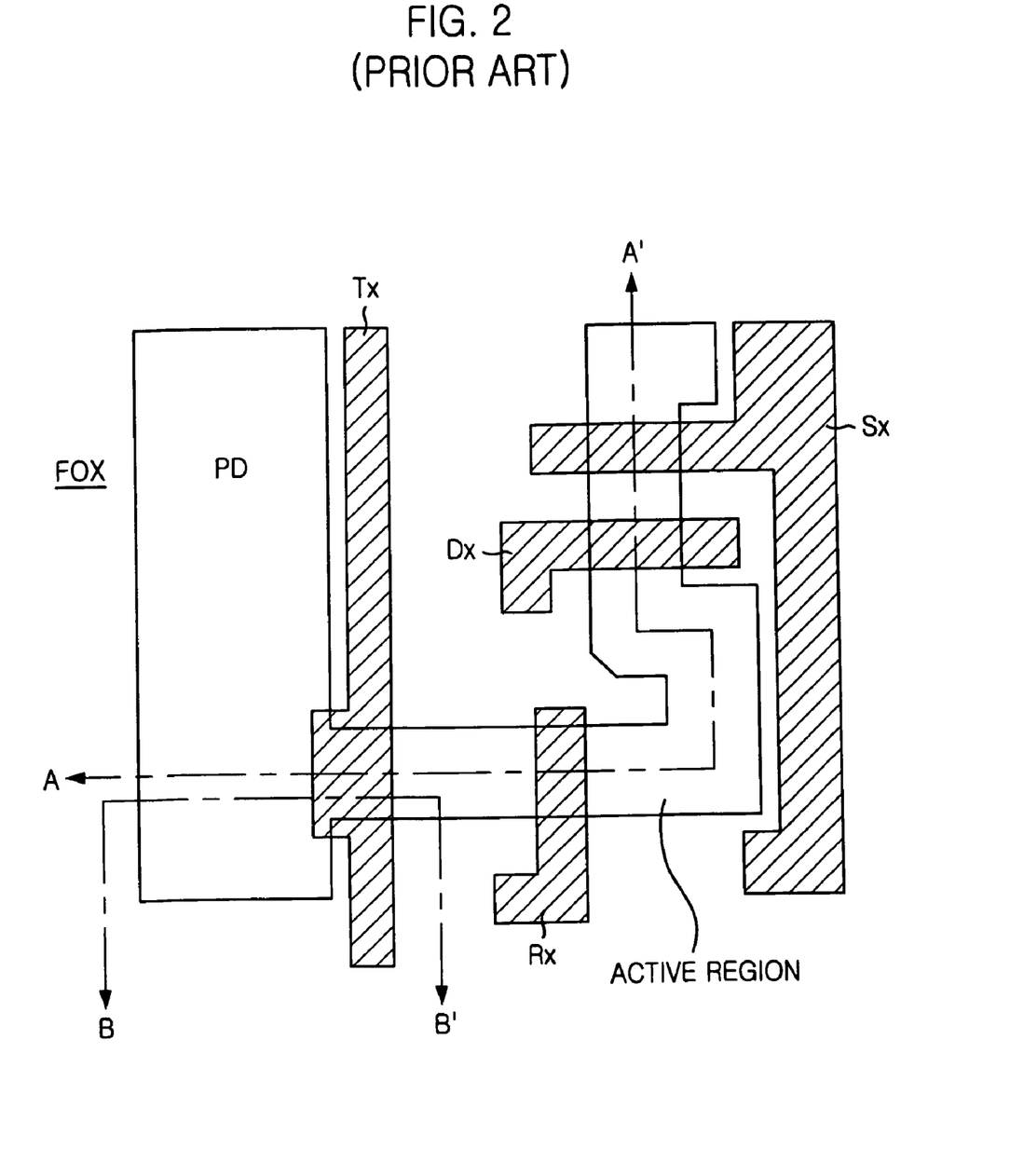
FIG. 2 is a plain diagram showing a layout of the CMOS image sensor shown in FIG. 1.
Figure 3:
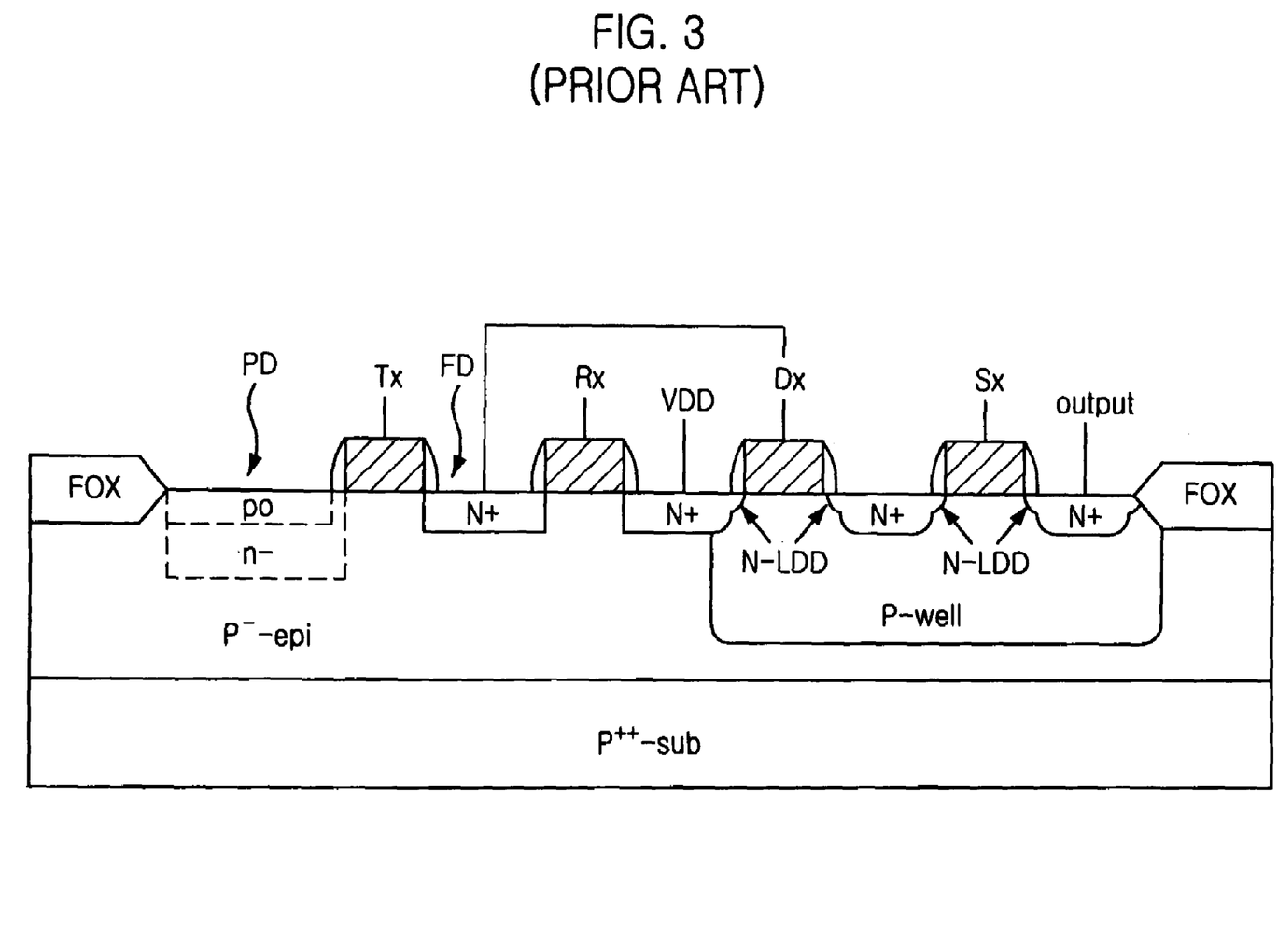
FIG. 3 is a cross-sectional view showing a conventional CMOS image sensor device taken along the line A-A' of FIG. 2.

FIG. 2 is a layout diagram of the CMOS image sensor UP shown in FIG. 1. FIG. 3 is a cross-sectional view showing a conventional CMOS image sensor taken along the line A-A', of FIG. 2. Referring to FIGS. 2 and 3, a p$^-$-epitaxial (p$^-$-epi) layer is grown on a p$^{++}$ substrate (p$^{++}$-sub) and a field oxide layer (FOX) is formed in a predetermined portion of the p$^-$-epitaxial layer. A p-well is formed in a predetermined portion of the p$^-$-epitaxial layer and a drive gate (Dx) and a select gate (Sx) are formed within the p-well. On the p-epitaxial layer, where the p-well is not formed, a transfer gate (Tx) and a reset gate (Rx) are formed, and a photodiode (PD) is formed between one-side of a transfer gate (Tx) and the FOX.

Figure 4:
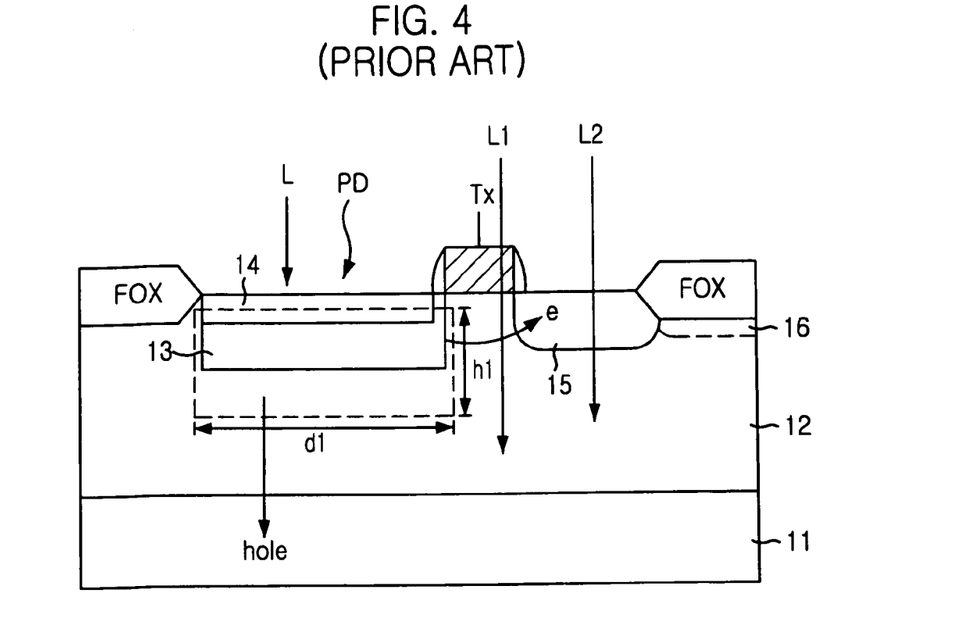
FIG. 4 is a cross-sectional view showing a conventional CMOS image sensor device taken along the line B-B' of FIG. 2.

FIG. 4 is a cross-sectional view showing the photodiode and transfer gate of a conventional CMOS image sensor along a line B-B' in FIG. 2. Referring to FIG. 4, in a PNP-type photodiode, a p$^-$-epitaxial layer 12 is formed on a p$^{++}$ substrate 11, a deep n$^-$-diffusion layer 13 is formed within the p$^-$-epitaxial layer 12. A shallow p$^0$-diffusion layer 14 is formed on the deep n$^-$-diffusion layer 13 and at a portion of surface of the p$^-$-epitaxial layer 12.

The transfer gate (Tx) is formed on the p$^-$-epitaxial layer 12 at an edge of the photodiode (PD), and a source/drain of a transfer gate (Tx), in the form of a floating sensing node 15, is formed within the p$^-$-epitaxial layer 12. Also, a high concentration p$^+$-doping layer 16 is formed for preventing a punchthrough on a bottom portion of the FOX layer at the floating sensing node 15.

In the above-mentioned conventional method, when a reverse-bias is generated between the n$^-$-diffusion layer 13 of the photodiode and the surrounding p-region (p$^0$-diffusion layer 14 and p$^-$-epitaxial layer 12) and when a dopant concentration in the n$^-$-diffusion layer 13 and the p-region are properly controlled, the n$^-$-diffusion layer 13 is fully depleted and a depletion region diffuses below the n$^-$-diffusion layer 13 and into the p$^-$-epitaxial layer 12. The greater the reverse-bias, the further into the p$^-$-epitaxial layer 12 the depletion region extends. Reference numeral 'h1' shows a depth of a depletion layer.

In the image sensor with the photodiode PD, an electrical output signal (voltage or current) is obtained by removing electrons stored in the PD. Accordingly, since the greatest output signal is in proportional to the number of electrons removed from the PD, the number of electrons generated and stored within the PD by light should be increased to increase the amount of the output signal.

As above described, an electron generated in a depletion layer of a pinned PD is changed into an electrical signal (voltage or current). To form a depletion layer that extends sufficiently deep enough from a surface, an ion injection is carried out so that a dopant concentration of a surface layer (p$^0$-diffusion layer 14) is much higher than that of the layer(s) below it (n$^-$-diffusion layer 13 and p$^-$-epitaxial layer 12).

Meanwhile, in the above-mentioned conventional method, electron hole pairs (EHPs) are generated in the n$^-$-diffusion layer 13, which is a depletion layer. Of the pairs, holes (H) flow into the p$^{++}$ substrate 11, and electrons (e) are stored and moved into the floating sensing node 15 (or a floating diffusion region) through a transfer gate (Tx). From this current flow, an electrical signal representing image data may be created.

The above-mentioned conventional method, unfortunately limits the area of the PD to an area much smaller than that of the unit pixel UP. Accordingly, the generation rate and storage area is small and does not have a high light sensitivity. That is, the n$^-$-diffusion layer 13 is formed only in a region where light (L) incident on the PD may be converted to image data but, other light (e.g., L$_1$ and L$_2$), that is incident other region outside the PD, will not be so converted. As a result, the light sensitivity of other region is substantially lower than that of the region over which (L) incident, that is, if it is light sensitive at all.

SUMMARY OF THE INVENTION

In accordance with one aspect of the present invention, there is provided an image sensor comprising: a first semiconductor substrate doped with a first conductive dopant; a first diffusion layer formed in the semiconductor substrate and doped with a second conductive dopant; a second diffusion layer formed in the semiconductor substrate adjacent the first diffusion layer and having a width wider than a width of the first diffusion layer; a third diffusion layer doped with the first conductive dopant and formed at an exposed surface of the semiconductor substrate in the first diffusion layer; a gate electrode formed on the exposed surface and having a first edge adjacent to the third diffusion layer; and a fourth diffusion layer doped with the second conductive dopant and formed at the exposed surface adjacent a second edge of the gate electrode, the fourth diffusion layer defining a gap with the second diffusion layer.

In accordance with another aspect of the present invention, there is provided an image sensor, wherein the first conductive dopant is a p-type dopant and the second conductive dopant is a n-type dopant.

In accordance with still another aspect of the present invention, there is provided a method of manufacturing an image sensor, comprising the steps of: a) forming a first diffusion layer within a semiconductor substrate, the semiconductor substrate being doped of a first conductive dopant and the first diffusion layer being doped of a second conductive dopant; b) forming a gate electrode on the semiconductor substrate, the gate electrode having a first sidewall and a second sidewall; c) forming a second diffusion layer in the semiconductor substrate adjacent the first diffusion layer; d) forming a first spacer at the first sidewall and a second spacer at the second sidewall; e) forming a third diffusion layer in the first diffusion layer adjacent the first spacer, the third diffusion layer being doped with the first conductive dopant; and f) forming a fourth diffusion layer within the semiconductor substrate adjacent the second spacer, the fourth diffusion layer being doped with the second conductive dopant.

In accordance with further still another aspect of the present invention, there is provided a method of manufacturing an image sensor, comprising the steps of: a) forming a first diffusion layer within a semiconductor substrate, the semiconductor substrate being doped of a first conductive dopant and the first diffusion layer being doped of a second conductive dopant; b) forming a gate electrode on the semiconductor substrate, the gate electrode having a first sidewall and a second sidewall; c) forming a second diffusion layer in the semiconductor substrate adjacent the first diffusion layer; d) forming a first spacer at the first sidewall and a second spacer at the second sidewall; e) forming a third diffusion layer in the first diffusion layer adjacent the first spacer, the third diffusion layer being doped with the first conductive dopant; f) forming a fourth diffusion layer within the semiconductor substrate adjacent the second spacer, the fourth diffusion layer being doped with the second conductive dopant; and g) forming a fifth diffusion layer between the fourth diffusion layer and the second diffusion layer.

BRIEF DESCRIPTION OF THE DRAWINGS

Other objects and aspects of the disclosure will become apparent from the following description of the embodiments with reference to the accompanying drawings, in which.

DETAILED DESCRIPTION OF THE INVENTION

A method of manufacturing an image sensor will be described in detail referring to the accompanying drawings.

Figure 5:
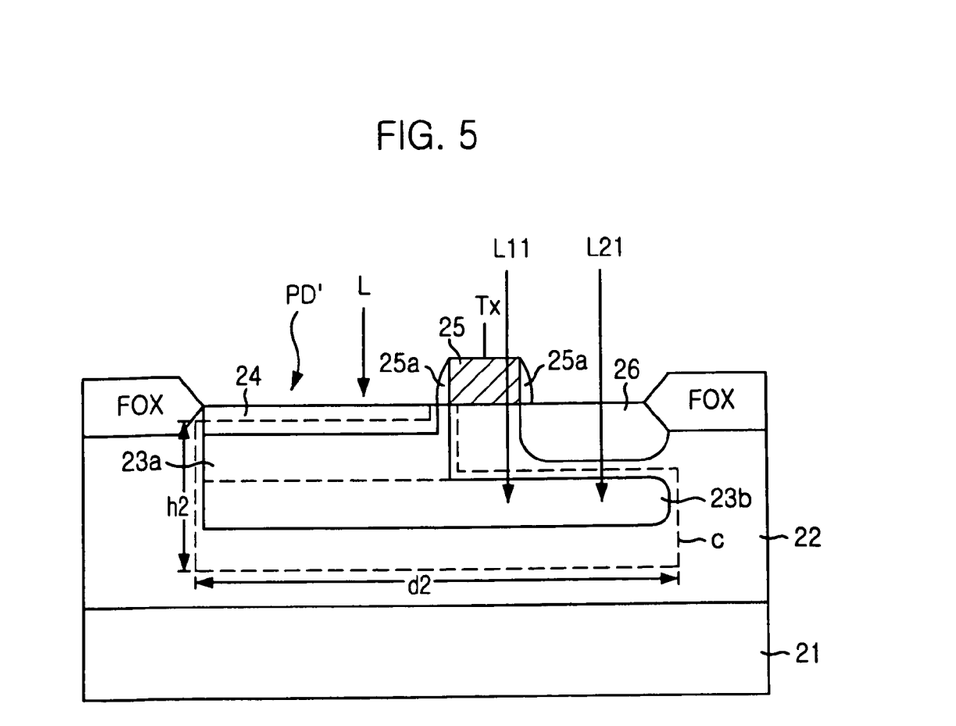
FIG. 5 is a cross-sectional view showing a CMOS image sensor device in accordance with a first embodiment.

FIG. 5 is a cross-sectional view showing a CMOS image sensor device having a field insulating layer, a photodiode and a transfer gate in accordance with a first embodiment of the disclosed. By way of example, FIG. 5 may be a cross-sectional view of a CMOS image sensor, showing a view similar to that taken along the line B-B' in FIG. 2. According to a first embodiment, a photodiode (PD') includes a low concentration $p^-$-epitaxial layer 22, an $n^-$-diffusion layer having first and second $n^-$-diffusion layers 23a and 23b and a $p^0$-diffusion layer 24. The low concentration $p^-$-epitaxial layer 22 is an epitaxial layer grown on a $p^{++}$ substrate 21. The first and second $n^-$-diffusion layers 23a and 23b are formed in the $p^-$-epitaxial layer 22, and the second $n^-$-diffusion layer 23b is wider than the first $n^-$-diffusion layer 23a. Further the first $n^-$-diffusion layer 23a is formed on the second $n^-$-diffusion layer 23b. The $p^0$-diffusion layer 24 is formed in an area of the first $n^-$-diffusion layer 23a so that it is disposed below an exposed surface of the $p^-$-epitaxial layer 22 and the second $n^-$-diffusion layer 23b. The width of the $p^0$-diffusion layer 24 is narrower than that of the second $n^-$-diffusion layer 23b.

A gate electrode 25 of the transfer gate (Tx) having a spacer 25a is formed on the $p^-$-epitaxial layer 22 between the photodiode (PD') and a floating sensing node 26 where $n^+$ dopants are doped.

The photodiode (PD'), the transfer gate (Tx) and the floating sensing node 26 are isolated from an adjacent device by a field insulating layer FOX.

In an operation of the photodiode PD', when the transfer gate (Tx) and a reset gate (Rx) (not shown) are turned on, a voltage (VDD) from a voltage source is applied to the first $n^-$-diffusion layer 23a and the second $n^-$-diffusion layer 23b, thereby generating a depletion region. When the $n^-$-diffusion layer 23a and the $n^-$-diffusion layer 23b are in a complete depletion condition (C), a depletion layer depth (h2) results. The depletion layer depth (h2) is much deeper and wider than the pk-diffusion layer 24.

In contrast, in the conventional structure of FIG. 4, a single deep $n^-$-diffusion layer 13 is provided, and under complete depletion, the depletion layer depth is 'h1' and the width is '$d_1$', as shown. Comparing FIG. 4 with FIG. 5, 'h2' of FIG. 5 is larger than the 'h1' in FIG. 4, because the thickness of the $n^-$-diffusion layer of FIG. 5, which has the first $n^-$-diffusion layer 23a and the second $n^-$-diffusion layer 23b, is much thicker than that of conventional $n^-$-diffusion layer 13. Meanwhile, the $n^-$-diffusion layer 13 of the conventional method and the second $n^-$-diffusion layer 23b of the present invention have the same physical depth and width.

In the embodiment of FIG. 5, a two-layer $n^-$-diffusion layer is formed through a plurality of ion injections having different energy levels to form the $n^-$-diffusion layers 23a and 23b to form a thick n-diffusion layer. Therefore, the depth and width of the depletion region are increased in operating the photodiode PD', and the area of the depletion region is increased.

If the depth and width of the photodiode PD' depletion region are increased, the electron generation and storage area in creating image data are increased, thereby improving light-sensitivity within the image sensor. In other words, incident light (L) incident upon the photodiode PD' and light ($L_{11}$, $L_{21}$) incident upon other regions of the sensor outside of the PD' will be converted to image data due to the sensitivity on the $n^-$-diffusion layer 23a.

The ion injection energy and the depth of the first $n^-$-diffusion layer 23a is modulated to avoid forming a short circuit between the floating sensing node 26 of the $n^+$ doped region and the first $n^-$-diffusion layer 23a when the $n^-$-diffusion layer 23a is completely depleted.

Figure 6A:
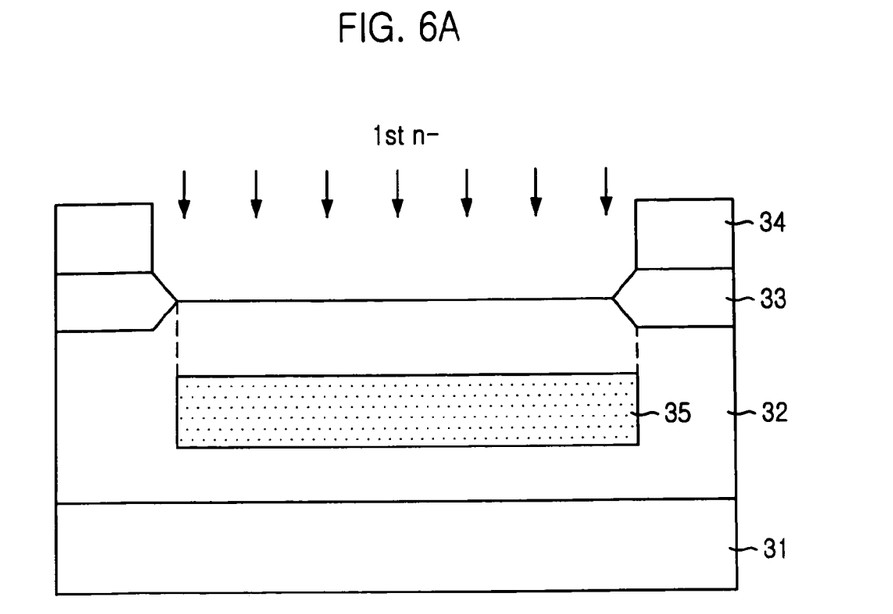
FIGS. 6a to 6d are cross-sectional views showing a manufacturing process of a CMOS image sensor in accordance with the first embodiment.

FIGS. 6a to 6d are cross-sectional views showing a manufacturing process of a CMOS image sensor in accordance with an embodiment like that of FIG. 5. Referring to FIG. 6a, a $p^-$-epitaxial layer 32 having a low concentration p-type dopant is formed on a p$^{++}$ substrate 31 having a high concentration p-type dopant. The p$^-$-epitaxial layer 32 is grown such that the depth of a depletion region of a photodiode is increased to obtain higher light sensitivity. Also, a unit pixel cross talk phenomena typically caused by an irregular movement of light electric charge, is prevented through re-combination of the light electric charges within the high concentration p$^{++}$ substrate 31.

Next, a field insulating layer 33 for insulating adjacent unit pixels or other components is formed in a predetermined part of the p$^-$-epitaxial layer 32 with a local oxidation of silicon (LOCOS) method. A photoresist layer is covered on the resulting structure including a field insulating layer 33.

The photoresist layer is selectively patterned to cover the field insulating layer 33 and a first mask 34, thereby exposing the top surface of the p$^-$-epitaxial layer 32. A low concentration of n-type dopants are ion-injected with high energy to the p$^-$-epitaxial layer 32 using the first mask 34 as an ion injection mask, and then a first n$^-$-diffusion layer 35 having deep depth and wide area is formed.

Before forming the above-mentioned field insulating layer 33 and the first n$^-$-diffusion layer 35, a p-well may be formed in a predetermined region (not shown) of the p$^-$-epitaxial layer 32 to include the drive gate (Dx) and the select gate (Sx) through a side diffusion by a thermal treatment, similar to that of FIG. 3.

After forming the first n$^-$-diffusion layer 35, a general transistor manufacturing process is carried out to form the drive gate (Dx) and the select gate (Sx) of the four gates of the image sensor. That is, within the p-well, an ion injection process of a threshold voltage modulating ion, to regulate the threshold voltage of a transistor, and a deep ion injection process of a p-type dopant, to regulate punchthrough characteristics of the device, are performed. These ion injection processes are not performed in a region of the device where a photodiode and the source drain of the transfer gate (Tx) are to be formed.

Figure 6B:
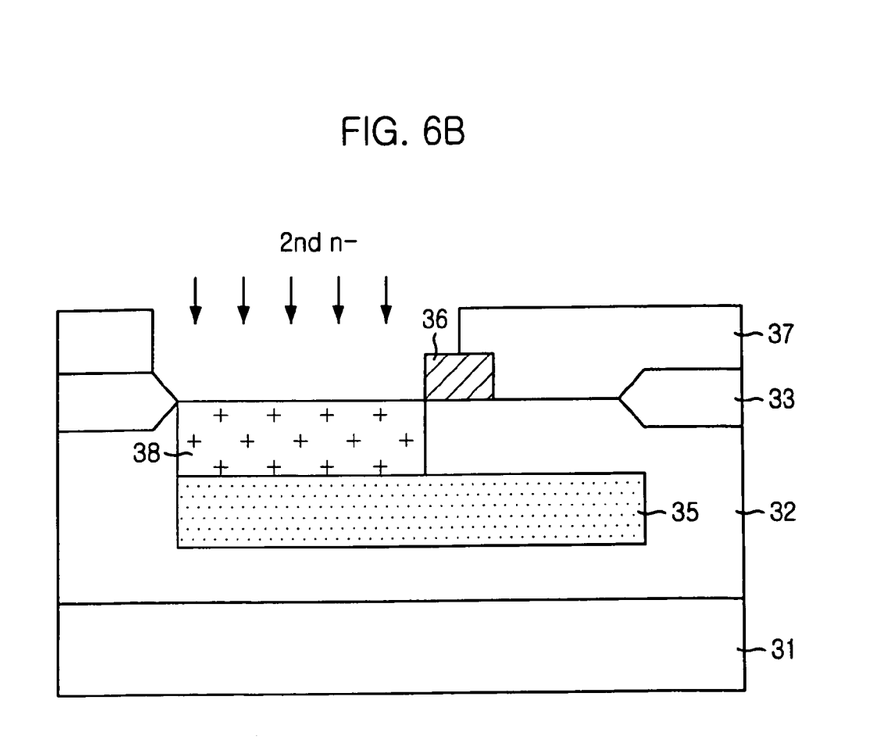

Referring to FIG. 6b, the mask 34 is striped and a conductive layer is deposited for forming four gates of the transistor. A photoresist layer is covered and patterned via an exposure and development to form a photoresist pattern (not shown) for forming the gate electrodes. The doping profile of a photodiode determines an electric charge transfer effect, which can be used to result in a desired thickness for the gate electrodes. Accordingly, a high energy n-type dopant ion injection and a low-energy p-type dopant ion injection are used for forming the photodiode to one side of a transfer gate (Tx).

The conductive layer is etched using a photoresist pattern to form the gate electrodes of the transistor(s) of a unit pixel. By way of example, the gate electrode 36, shown in FIG. 6B, is a gate electrode of the transfer gate (Tx).

A photoresist layer is covered on the resulting structure including the gate electrode 36, and a second mask 37 for ion injecting is applied, and a high energy n-type dopant region is formed by selectively patterning the photoresist layer.

At this time, one-side of the second mask 37 is arranged in a center of a transfer gate (Tx) above gate electrode 36, and the other side is arranged in a predetermined part of the field insulating layer 33 without entering in an active region. Subsequently, a low concentration n-type dopant is ion injected using the second mask 37 as an ion injection mask, and above the first n$^-$-diffusion layer 35, a second n$^-$-diffusion layer 38 is formed on one side of where the transfer gate (Tx) is to be formed.

The second n$^-$-diffusion layer 38 is formed by an ion injection energy that is much lower than that of the first n$^-$-diffusion layer 35. The thickness depth (thickness) is deeper and an area occupied much larger for the p$^-$-epitaxial layer 32 as compared to the n$^-$-diffusion layer 38.

A first deep pn junction may be formed in a low concentration of the p$^-$-epitaxial layer 32, through the ion injection process forming the first n$^-$-diffusion layer 35 and the second n$^-$-diffusion layer 38. Next, an ion injection process for forming the source/drain regions of the four transistor gates of a unit pixel transistor is performed.

First, a photoresist layer is applied on the resulting structure and a third mask (not shown) is formed, to form a lightly doped drain (LDD) structure, by patterning the photoresist layer with an exposure and development. A low concentration n-type dopant is then injected using the third mask as an ion injection mask within a p-well (not shown) to form the LDD region (not shown). The ion injection is not performed in a region where the photodiode or the native transistors (Tx and Rx) are to be formed.

Figure 6C:
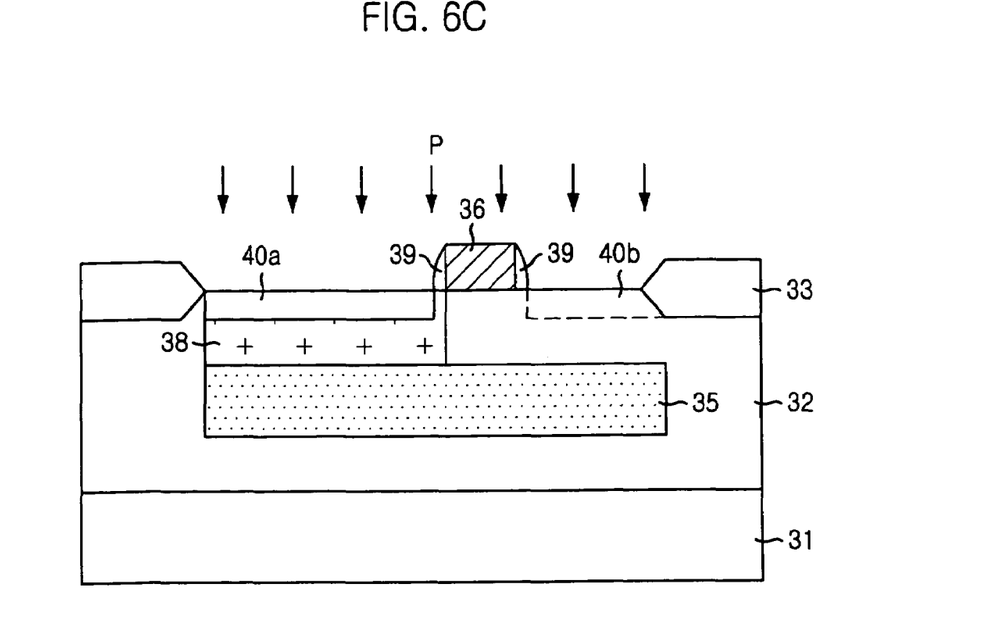

Referring to FIG. 6c, after removing the third mask, an insulating layer or spacer is deposited on the resulting structure, and then the insulating layer is blanket etched to form a spacer 39 contacting the sidewalls of the gate electrode 36 on each of the four transistors.

Diffusion layers 40a and 40b are simultaneously formed on an exposed surface of the p$^-$-epitaxial layer 32, including the second n$^-$-diffusion layer 38 and the other side of a transfer gate electrode 36 by a low energy p-type dopant using a blanket ion injection method. At this time, the p$^0$-diffusion layer 40a formed within the second n$^-$-diffusion layer 38 is isolated from the gate electrode 36 by the thickness of the spacer 39.

The p$^0$-diffusion layer 40b formed on an exposed p$^-$-epitaxial layer 32 is ion-injected with a lower energy n-type dopant, so the p$^0$-diffusion layer 40b has a shallow depth. The p$^0$-diffusion layer 40b is not in contact with the first n$^-$-diffusion layer 35, but formed with a p-type dopant as is the p$^-$-epitaxial layer 32.

A second shallow PN junction is formed comprising the p$^0$-diffusion layers 40a and the first and second n$^-$-diffusion layers 35 and 38 through the above-mentioned ion injection of a p-type dopant. A PNP-type photodiode is formed by the p$^-$-epitaxial layer 32, the first and second n$^-$-diffusion layers 35 and 38, and the p$^0$-diffusion layer 40a.

Figure 6D:
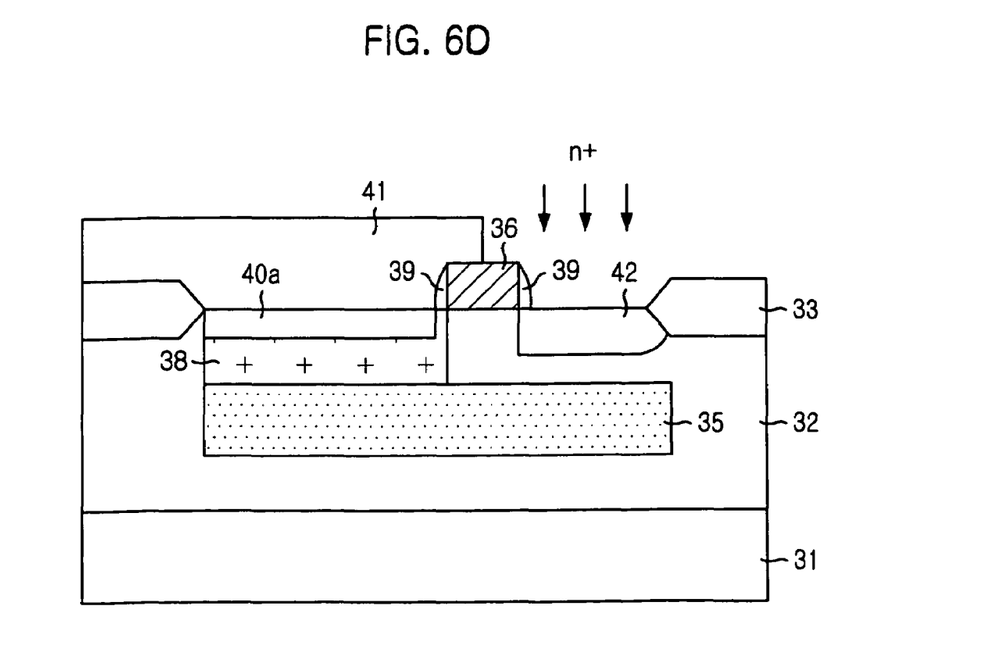

Referring to FIG. 6d, a photoresist layer is formed on the resulting structure and a fourth mask 41 is formed to form a source/drain region of the transistor by patterning the resulting structure with an exposure and a development process.

A high concentration n-type dopant n$^+$ is ion-injected, with the fourth mask 41 as an ion injection mask to form n$^+$-diffusion layer 42. As a result, two drive gates (Dx) of the general NMOS transistor, a source/drain region (not shown) of a select gate (Sx), two transfer gates (Tx) of the NMOS transistor and a source/drain region (a floating sensing node) of a reset gate (Rx) may be formed. At this time, the fourth mask 41 exposes, a side of a transfer gate (Tx) and a portion of the p$^-$-epitaxial layer 32. The fourth mask 41 extends to a center of a transfer gate (Tx). In the region where the photodiode is to be formed, a high concentration n-type dopant is not ion-injected.

The above-mentioned embodiment forms the first n$^-$-diffusion layers 38, which forms a photodiode of an entire area of a unit pixel, so that an area of the photodiode is largely extended over that of conventional image sensors.

The photodiode generates electrons that are converted to image data not only from incident light as in a conventional photodiode, but also from the light incident over the whole area of the unit pixel.

Figure 7:
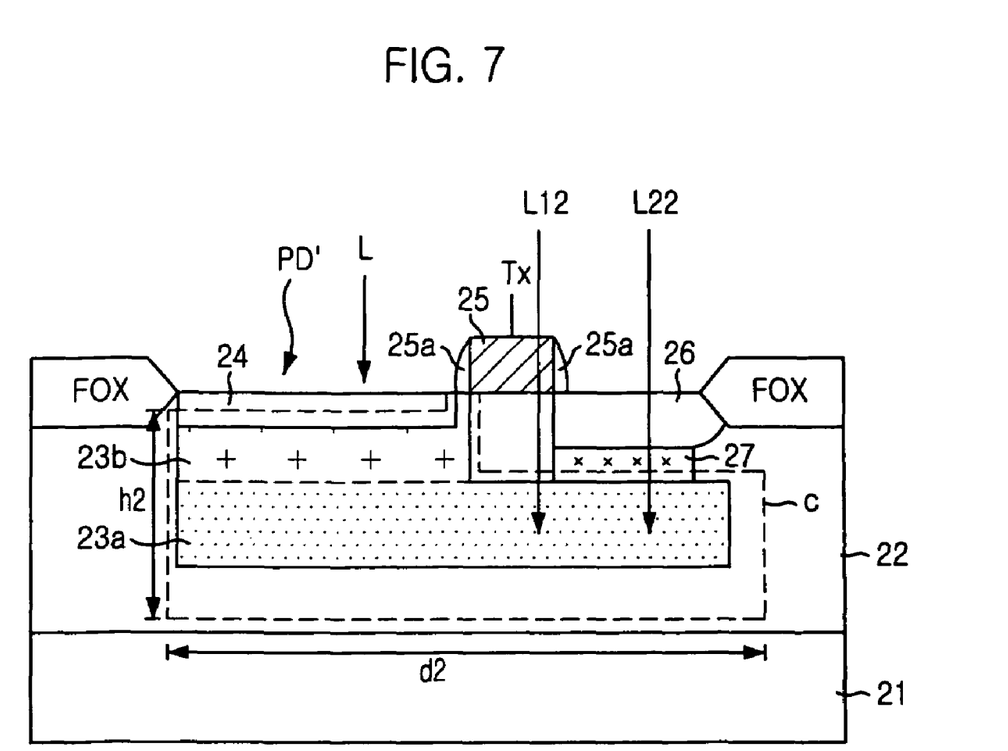
FIG. 7 is a cross-sectional view showing a CMOS image sensor device in accordance with a second embodiment.

FIG. 7 is a cross-sectional view showing a CMOS image sensor device having a field insulating layer, a photodiode and a transfer gate in accordance with a second embodiment. FIG. 7 is a cross-sectional view of a CMOS image sensor showing a view similar to that taken along the cross-section line B-B' of FIG. 2. The plain view of the structure of FIG. 7, like that of FIG. 5, may be like that of the prior art. The same elements in FIGS. 5 and 7 are denoted with the same reference numerals.

Referring to FIG. 7, a photodiode according to an embodiment includes the low concentration $p^-$-epitaxial layer 22, the $n^-$-diffusion layer having first and second $n^-$-diffusion layers 23a and 23b and the $p^0$-diffusion layer 24. The low concentration $p^-$-epitaxial layer 22 is an epitaxial layer grown on the $p^{++}$ substrate 21. The first and second $n^-$-diffusion layers 23a and 23b are formed in the $p^-$-epitaxial layer 22, and the second $n^-$-diffusion layer 23b has a wider width than the first $n^-$-diffusion layer 23a. Further the first $n^-$-diffusion layer 23a is formed on the second $n^-$-diffusion layer 23b. The $p^0$-diffusion layer 24 is formed in an area of the first $n^-$-diffusion layer 23a so that it is disposed between a surface of the $p^-$-epitaxial layer 22 and the second $n^-$-diffusion layer 23b. Accordingly, the width of the $p^0$-diffusion layer 24 is narrower than that of the second $n^-$-diffusion layer 23b.

A gate electrode 25 of a transfer gate (Tx) having a spacer 25a is formed on the $p^-$-epitaxial layer 22 adjacent the photodiode PD', and then a floating sensing node 26 where $n^+$ dopants are doped, is formed on a side of the transfer gate opposite the photodiode PD.

A $p^+$ diffusion layer 27 is formed between the floating sensing node 26 and the first $n^-$-diffusion layer 23a so as to prevent a short circuit between the two, and the photodiode PD', the transfer gate (Tx) and the floating sensing node 26 are isolated from an adjacent device by the field insulating layer FOX.

In operation of a photodiode according to FIG. 7, first, when the transfer gate (Tx) and the reset gate (Rx) (not shown) are turned on, voltage from a voltage supply VDD is applied to the first $n^-$-diffusion layer 23a and the second $n^-$-diffusion layer 23b, thereby generating a depletion region, and when the deep first $n^-$-diffusion layer 23a and the shallow second $n^-$-diffusion layer 23b are in a complete depletion (C) condition, the depletion layer depth (h2) is much deeper and a width (d2) of a depletion layer is much wider than the two layers 23a and 23b, as shown.

On the other hand, referring to FIG. 4 of the conventional method, a single deep $n^-$-diffusion layer 13 is provided. So if the deep $n^-$-diffusion layer 13 is in a condition of complete depletion, the depth of the depletion layer is only 'h1' and the width is only '$d_1$.'

Comparing FIG. 4 with FIG. 7, the 'h2' of FIG. 7 is larger than that of 'h1' in FIG. 4. The reason for this difference is that the thickness of the $n^-$-diffusion layer of FIG. 7, which includes the first $n^-$-diffusion layer 23a and the second $n^-$-diffusion layer 23b, is much thicker than the conventional $n^-$-diffusion layer 13. The $n^-$-diffusion layer 13 of the conventional method and the second $n^-$-diffusion layer 23b of the present invention have the same depth and width.

In the embodiment of FIG. 7, a two-layer $n^-$-diffusion layer is formed through a plurality of ion injections having different energy levels to form a thick $n^-$-diffusion layer including the two-layers. Therefore, a depth and a width of the depletion layer are increased when, operating a photodiode, and an area of a depletion layer is increased, by increasing the depth and width of a photodiode depletion layer electron generation and the photodiode storage area, thereby improving light sensitivity of the image sensor of an incident light.

Thus, light (L) incident upon the photodiode PD' and light ($L_{12}$, $L_{22}$) incident on other regions outside of the PD' where the first $n^-$-diffusion layer 23a extends will all be converted to image data. The light sensitivity of the image sensor is increased.

In the second embodiment, there is provided the $p^+$-diffusion layer 27 between the floating sensing node 26, that is an $n^+$ doped region, and the first $n^-$-diffusion layer 23a, so when the first $n^-$-diffusion layer 23a is completely depleted, an ion injection energy and depth of the first $n^-$-diffusion layer 23a will not be shorted. That is, the second embodiment restrains diffusion of change carriers from the first $n^-$-diffusion layer 23a to the floating sensing node 26.

Thus, in the second embodiment, there exist a processing margin for the ion injection energy and depth control time used in forming the first $n^-$-diffusion layer 23a that prevents a shorting of the $n^+$ doped floating sensing node 26 and the $n^-$-diffusion layer 23a when the $n^-$-diffusion layer 23a is fully depleted.

Figure 8A:
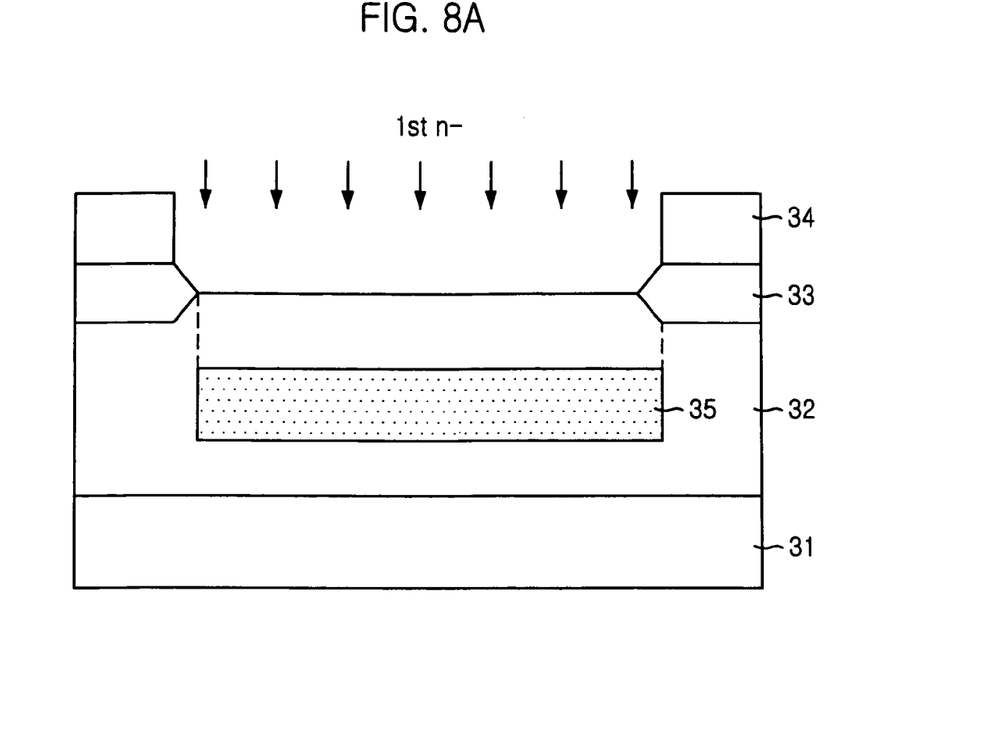
FIGS. 8a to 8d are cross-sectional views showing a manufacturing process of a CMOS image sensor in accordance with the second embodiment.

FIGS. 8a to 8d are cross-sectional views showing a manufacturing process to form a CMOS image sensor in accordance with the embodiment of FIG. 7. Referring to FIG. 8a, $p^-$-epitaxial layer 32 where a low concentration p-type dopant is doped is formed on a $p^{++}$ substrate 31 where a high concentration p-type dopant is doped. The reason for growing the $p^-$-epitaxial layer 32 is that the depth of the depletion layer of a photodiode may be increased to obtain higher light sensitivity through a low concentration $p^-$-epitaxial layer 32. Also, the cross talk phenomena of a unit pixel caused by an irregular movement of light electric charge, which may be generated from a deep portion of the $p^{++}$ substrate 31, is prevented through re-combination of light electric charges with the existence of the high concentration $p^{++}$ substrate 31.

Next, a field insulating layer 33 for separating the unit pixels is formed in a predetermined part of the $p^-$-epitaxial layer 32 with a local oxidation of silicon (LOCOS) method, and a photoresist layer is covered on the resulting structure including the field insulating layer 33.

The photoresist layer is selectively patterned to cover the field insulating layer 33 and a first mask 34, which exposes the surface of the $p^-$-epitaxial layer 32. After that, low concentration n-type dopants are ion-injected with high energy to the $p^-$-epitaxial layer 32 using the first mask 34 as an ion injection mask and then a first $n^-$-diffusion layer 35 having deep depth and wide area is formed.

Before forming the above-mentioned the field insulating layer 33 and the first $n^-$-diffusion layer 35, a p-well (not shown) is formed in a predetermined region of the $p^-$-epitaxial layer 32, to include a drive gate (Dx) and a select gate (Sx), through a side diffusion by a thermal treatment.

After forming the first $n^-$-diffusion layer 35, a general transistor manufacturing process is carried out to form a drive gate (Dx) and a select gate (Sx) of the four transistors of unit pixel. That is, within the p-well, an ion injection process of a threshold voltage modulating ion, which regulates threshold voltage of a transistor, and a deep ion injection process of a p-type dopant, which regulates a punchthrough characteristic, are performed. The ion injection processes are not performed in a region where the photodiode (PD') and a source/drain of a transfer gate (Tx) are to be formed.

Figure 8B:
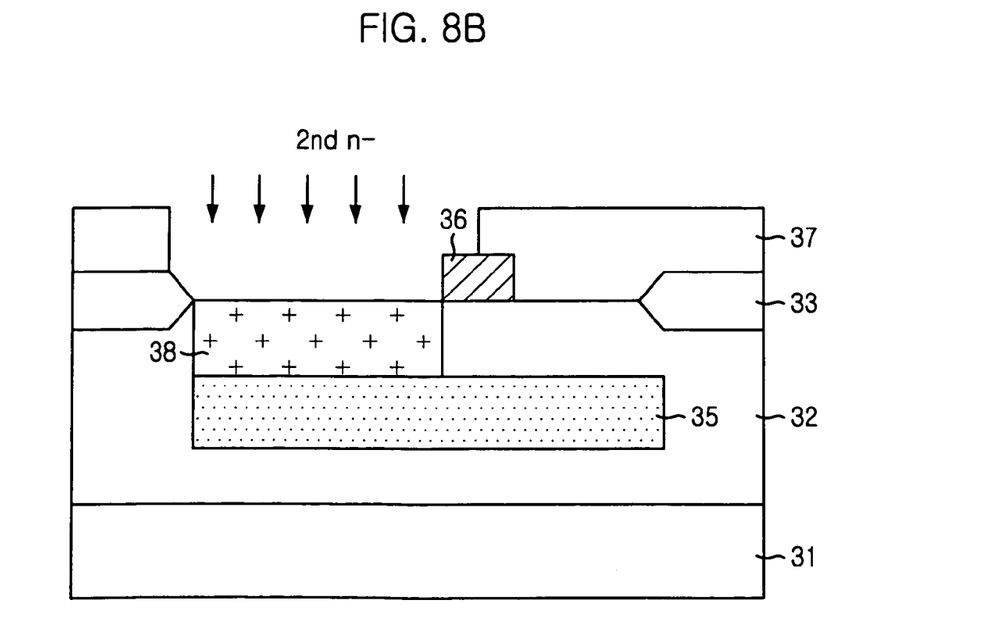

Referring to FIG. 8b, a first mask 34 is stripped and a conductive layer is deposited to form the four transistor gates of the unit pixel, and then a photoresist layer is covered and patterned through an exposure and development, thereby to form a photoresist pattern (not shown) for forming a gate electrode. At this time, a doping profile of a photodiode on one-side of a transfer gate (Tx) to be formed, determines an electric charge transfer effect. Accordingly, a high energy n-type dopant ion injection for forming a photodiode and a low-energy p-type dopant ion injection are arranged on one side of a transfer gate (Tx).

Next, the conductive layer is etched using a photoresist pattern or etching mask for forming a gate electrode, and four gate electrodes 36 of the unit pixel transistor are formed. The gate electrode 36 shown in FIG. 8B is a gate electrode of a transfer gate (Tx).

A photoresist layer is covered on the resulting structure including the gate electrode 36 and the second mask 37 for ion injecting and a high-energy n-type dopant is formed by selectively patterning the photoresist layer. At this time, one-side of the second mask 37 is arranged in a center of a transfer gate (Tx), and the other side is arranged in a predetermined part of the field insulating layer 33, without entering in an active region.

Subsequently, a low concentration n-type dopant is ion injected using the second mask 37 as an ion injection mask, and the first $n^-$-diffusion layer 35 and the second $n^-$-diffusion layer 38 are formed on one side (a photodiode side) of a transfer gate (Tx). The second $n^-$-diffusion layer 38 is formed by an ion injection energy, which is much lower than that of the first $n^-$-diffusion layer 35, and the depth (thickness) is deeper and an area occupied by the $p^-$-epitaxial layer 32 is much wider than that of $n^-$-diffusion layer 38.

A first deep pn junction may be formed in a low concentration of the $p^-$-epitaxial layer 32 through the ion injection process that forms the first $n^-$-diffusion layer 35 and the second $n^-$-diffusion layer 38.

Next, an ion injection process for forming source/drain of four transistor gates of a unit pixel is performed.

First, a photoresist layer is applied on the resulting structure and a third mask (not shown) is formed for forming a lightly doped drain (LDD) structure by patterning the photoresist layer with an exposure and development, and then, a low concentration n-type dopant is injected using the third mask as an ion injection mask within a p-well (not shown) to form the LDD region (not shown). The ion injection for forming the LDD region is not performed in a region where the photodiode and two of native transistors (Tx and Rx) are to be formed.

Figure 8C:
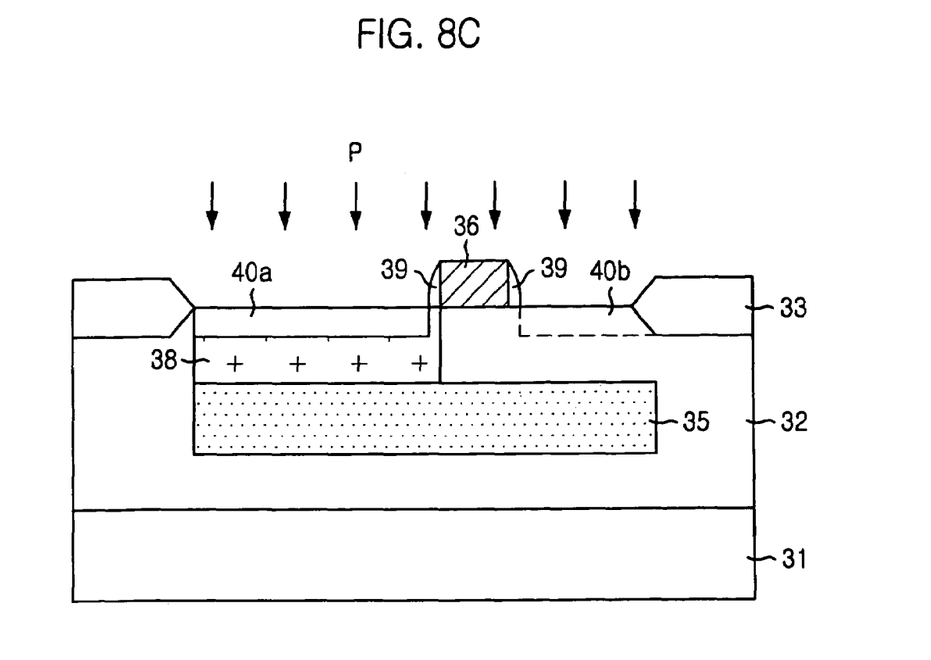

Referring to FIG. 8c, after removing the third mask, an insulating layer is deposited on the resulting structure, and then the insulating layer is blanket etched to form a spacer 39 contacting the sidewalls of the gate electrode 36.

Diffusion layers 40a and 40b are simultaneously formed on the exposed $p^-$-epitaxial layer 32, including the second $n^-$-diffusion layer 38, and on the other side of the transfer gate (Tx) by a low energy p-type dopant ($p^0$) blanket ion injection method. At this time, the $p^0$-diffusion layer 40a formed within the second $n^-$-diffusion layer 38 is isolated by the thickness of the spacer 39.

The $p^0$-diffusion layers 40b is ion injected with a lower energy p-type dopant, so a depth of the $p^0$-diffusion layers 40b has a shallow depth. Therefore, the $p^0$-diffusion layer 40b is not in contact with the first $n^-$-diffusion layer 35, but formed with p-type dopant, as with the $p^-$-epitaxial layer 32.

A second shallow pn connection is formed comprising the $p^0$-diffusion layers 40a. The first and the second $n^-$-diffusion layers 35 and 38 are formed through the above-mentioned ion injection of p-type dopant, and then a pnp-type photodiode is formed from the $p^-$-epitaxial layer 32, the first and second $n^-$-diffusion layers 35 and 38 and the $p^0$-diffusion layer 40a.

Figure 8D:
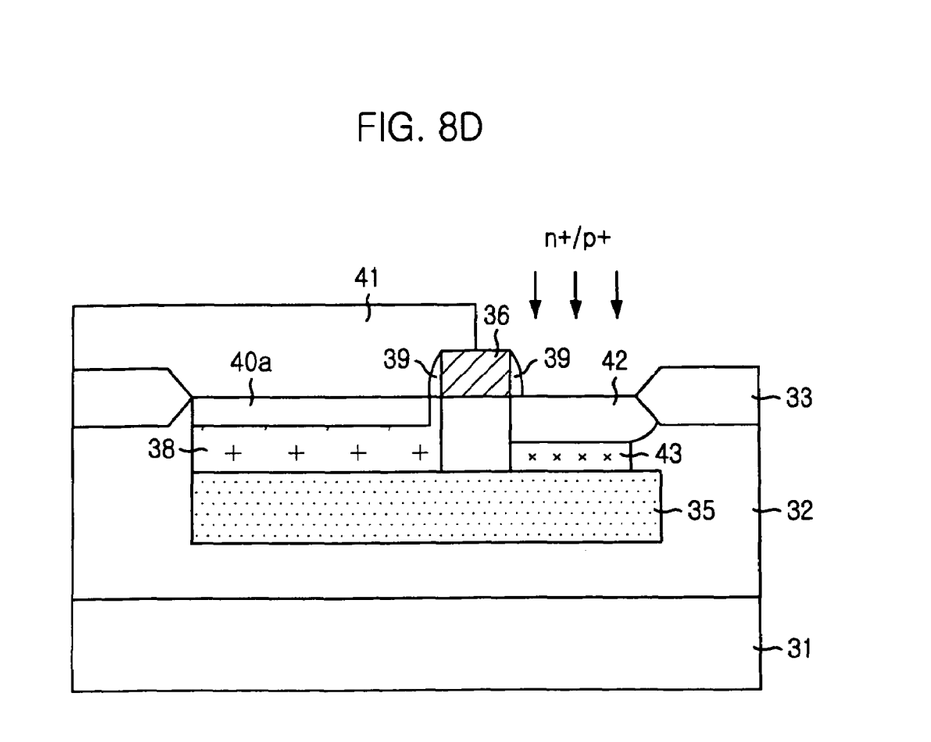

Referring to FIG. 8d, a photoresist layer is formed on the resulting structure and a fourth mask 41 is formed to form a source/drain region by patterning the resulting structure with an exposure and a develop process. A high concentration n-type dopant $n^+$ is ion injected using the fourth mask 41 as an ion injection mask to form $n^+$-diffusion layer 42. As a result, two drive gates (Dx) of general NMOS transistor, a source/drain region (not shown) of a select gate (Sx), two transfer gates (Tx) of general native NMOS transistor and a source/drain region (a floating sensing node) of a reset gate (Rx) of the NMOS transistor are formed.

At this time, the fourth mask 41 exposes the other side of the transfer gate (Tx) and the $p^-$-epitaxial layer 32 around the other side, and the fourth mask 41 is arranged in a center of a transfer gate (Tx). That is, in a region where a photodiode is formed, a high concentration n-type dopant is not ion-injected.

Next, a high concentration p-type dopant is ion-injected using the same fourth mask 41, and then a $p^+$-diffusion layer 43 is formed on a bottom portion of a $n^+$-diffusion layer 42 and on a upper portion of the first $n^-$-diffusion layer 35. At this time, ion injection energy for forming the $p^+$-diffusion layer 43 is bigger than that of the $n^+$-diffusion layer 42.

The above-mentioned $p^+$-diffusion layer 43 has a high concentration and it performs a different operation than the $p^-$-epitaxial layer 32. For example, when the first $n^-$-diffusion layer 35 is completely depleted, the $p^+$-diffusion layer 43 prevents the $n^+$-diffusion layer 42 and the first $n^-$-diffusion layer 35 from shorting. After removing the fourth mask 41, a thermal treatment is carried out to activate an ion-injected dopant.

An image sensor manufactured according to the above-mentioned second embodiment forms the first $n^-$-diffusion layers 38, which forms a photodiode over the whole area of a unit pixel, much longer and wider than conventional devices, so an area of a photodiode is largely extended.

The photodiode, which is largely extended in area, generates electron charge carriers that not only represent incident light in a conventional photodiode, but also represent incident light received over the entire area of a unit pixel.

In the second embodiment, after forming the $n^+$-diffusion layer 42, the $p^+$-diffusion layer 43 is additionally formed to prevent a short between the first $n^-$-diffusion layer 35, which forms part of the photodiode and the $n^+$-diffusion layer 42, which forms the floating sensing node.

In the above-mentioned first and second embodiment, all the image sensors may be adapted to include a photodiode besides a CMOS image sensor.

The above-mentioned embodiments increase a photodiode region, through a deeper depletion layer of a photodiode, to improve light sensitivity to incident light. In addition, according to some embodiments, the area of the photodiode can be enlarged, therefore the deterioration of electrical characteristics of the image sensor can be protected by suppressing the short between the floating sensing node and the $n^-$-diffusion layer of the photodiode.

As one of ordinary skill in the art would understand from the disclosed embodiments provided is a method of manufacturing an image sensor having light sensitivity over a photodiode having an area equal to that of unit pixel.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An image sensor comprising:
    a first semiconductor substrate;
    a first diffusion layer formed in the semiconductor substrate and doped with a first conductive dopant;
    a second diffusion layer doped with the first conductive dopant and formed in the semiconductor substrate adjacent the first diffusion layer and having a width wider than a width of the first diffusion layer;
    a third diffusion layer formed at an exposed surface of the semiconductor substrate in the first diffusion layer;
    a gate electrode formed on the exposed surface and having a first edge adjacent to the third diffusion layer;
    a fourth diffusion layer formed at the exposed surface adjacent a second edge of the gate electrode, the fourth diffusion layer defining a gap with the second diffusion layer; and
    a fifth diffusion layer adjacent the second edge of the gate electrode and extending at least partially below the fourth diffusion layer, where a portion of the second diffusion layer is under the fifth diffusion layer.

2. The image sensor of claim 1, wherein a dopant concentration of the first diffusion layer is equal to a dopant concentration in the second diffusion layer, a dopant concentration of the third diffusion layer is higher than the dopant concentration of the first diffusion layer and a dopant concentration of the fourth diffusion layer is higher than the dopant concentration of the second diffusion layer.

3. The image sensor of claim 1, wherein the gate electrode further comprises a first spacer between the first edge of the gate electrode and the third diffusion layer and a second spacer between the second edge of the gate electrode and the fourth diffusion layer.

4. The image sensor of claim 1, wherein the semiconductor layer, the third diffusion layer and the fifth diffusion layer are doped with a second conductive dopant type, and the first diffusion layer, the second diffusion layer, and the fourth diffusion layer are doped with the first conductive dopant.

5. The image sensor of claim 4, wherein the second conductive dopant is a p-type dopant and the first conductive dopant is a n-type dopant.

6. An image sensor comprising:
    a first semiconductor substrate doped with a first conductive dopant;
    a first diffusion layer formed in the semiconductor substrate and doped with a second conductive dopant;
    a second diffusion layer doped with the second conductive dopant and formed in the semiconductor substrate adjacent the first diffusion layer and having a width wider than a width of the first diffusion layer;
    a third diffusion layer doped with the first conductive dopant and formed at an exposed surface of the semiconductor substrate in the first diffusion layer;
    a gate electrode formed on the exposed surface and having a first edge adjacent to the third diffusion layer;
    a fourth diffusion layer doped with the second conductive dopant and formed at the exposed surface adjacent a second edge of the gate electrode, the fourth diffusion layer defining a gap with the second diffusion layer; and
    a fifth diffusion layer doped with the first conductive dopant and formed between the fourth diffusion layer and the second diffusion layer, where a portion of the second diffusion layer is under the fifth diffusion layer.

7. The image sensor of claim 6, wherein a dopant concentration of the first diffusion layer is equal to a dopant concentration in the second diffusion layer, a dopant concentration of the third diffusion layer is higher than the dopant concentration of the first diffusion layer, a dopant concentration of the fourth diffusion layer is higher than the dopant concentration of the second diffusion layer, and a dopant concentration of the fifth diffusion layer is higher than the dopant concentration of the second diffusion layer.

8. The image sensor of claim 6, wherein the first conductive dopant is a p-type dopant and the second conductive dopant is a n-type dopant.

9. The image sensor of claim 6, wherein the gate electrode further comprises a first spacer between the first edge of the gate electrode and the third diffusion layer and a second spacer between the second edge of the gate electrode and the fourth diffusion layer.

10. The image sensor of claim 6, wherein the third diffusion layer and the fourth diffusion layer have the same width.

* * * * *